United States Patent [19]

Boehm et al.

[11] Patent Number: 4,861,534

[45] Date of Patent: Aug. 29, 1989

[54] METHOD AND APPARATUS FOR THE INJECTION MOLDING OF CIRCUIT BOARDS

[75] Inventors: Russell W. Boehm, Longmont, Colo.; Rex A. Guinn, Stamping Ground, Ky.; Hans J. Koerner, Round Rock, Tex.

[73] Assignee: International Business Machines Corporation, Armonk, N.Y.

[21] Appl. No.: 212,815

[22] Filed: Jun. 29, 1988

[51] Int. Cl.⁴ ............................................. B29C 45/26
[52] U.S. Cl. ..................................... 264/102; 264/219; 264/297.2; 264/328.1; 425/138; 425/190; 425/195; 249/64; 249/102
[58] Field of Search ...................... 249/60, 64, 98, 102, 249/151, 176; 425/135, 136, 138, 150, 183, 190, 192 R, 195, 542, 548, 553, 554, 572, 577, 436 R, 437, 441, 444; 264/40.1, 40.5, 102, 160, 161, 297.2, 294, 328.1, 328.8, 328.9, 328.11, 328.12, 328.14–328.16, 334, 335, 219

[56] References Cited

U.S. PATENT DOCUMENTS

| | | | |
|---|---|---|---|
| 3,438,127 | 4/1969 | Lehtonen | 29/625 |
| 3,889,363 | 6/1975 | Davis | 264/104 |
| 3,930,778 | 1/1976 | Roncelli | 425/556 |
| 4,164,523 | 8/1979 | Hanning | 264/335 |
| 4,342,549 | 8/1982 | Lemelson | 425/183 |
| 4,491,295 | 1/1985 | Thornton et al. | 249/53 |
| 4,505,661 | 3/1985 | Bielfeldt | 425/190 |
| 4,552,716 | 11/1985 | Habich | 264/328 |
| 4,591,220 | 5/1986 | Impey | 339/17 |
| 4,726,925 | 2/1988 | Binder | 264/328.12 |

Primary Examiner—Jan H. Silbaugh
Assistant Examiner—Jill L. Heitbrink
Attorney, Agent, or Firm—Carl M. Wright; Francis A. Sirr

[57] ABSTRACT

A family of circuit boards are molded, each board having its own unique pattern of recessed circuit paths and component insertion through-holes. A different mold is provided for each different member of the family. The two cavity blocks of each mold cavity contain only the holes that are necessary to define the through-hole pattern for that member of the family. A plurality of core pins or wires are provided at the molding site. Only the core pins that are required by the mold in use at the molding site are rendered operative. Features of the method and apparatus, in addition to this core pin insertion feature, include (1) the molding site includes a base member that is usable with all molds of the family, and has means for injecting molding material and means for ejecting a finished circuit board, the injection means and the ejecting means being located in the board's scrap edge area, (2) a hot runner injection system, (3) the mold cavity is placed under a partial vacuum prior to injection, (4) a semiconductor device is selectively used to rapidly heat or cool the mold, and (5) robot means, air and vacuum aids in ejection of a circuit board.

29 Claims, 4 Drawing Sheets

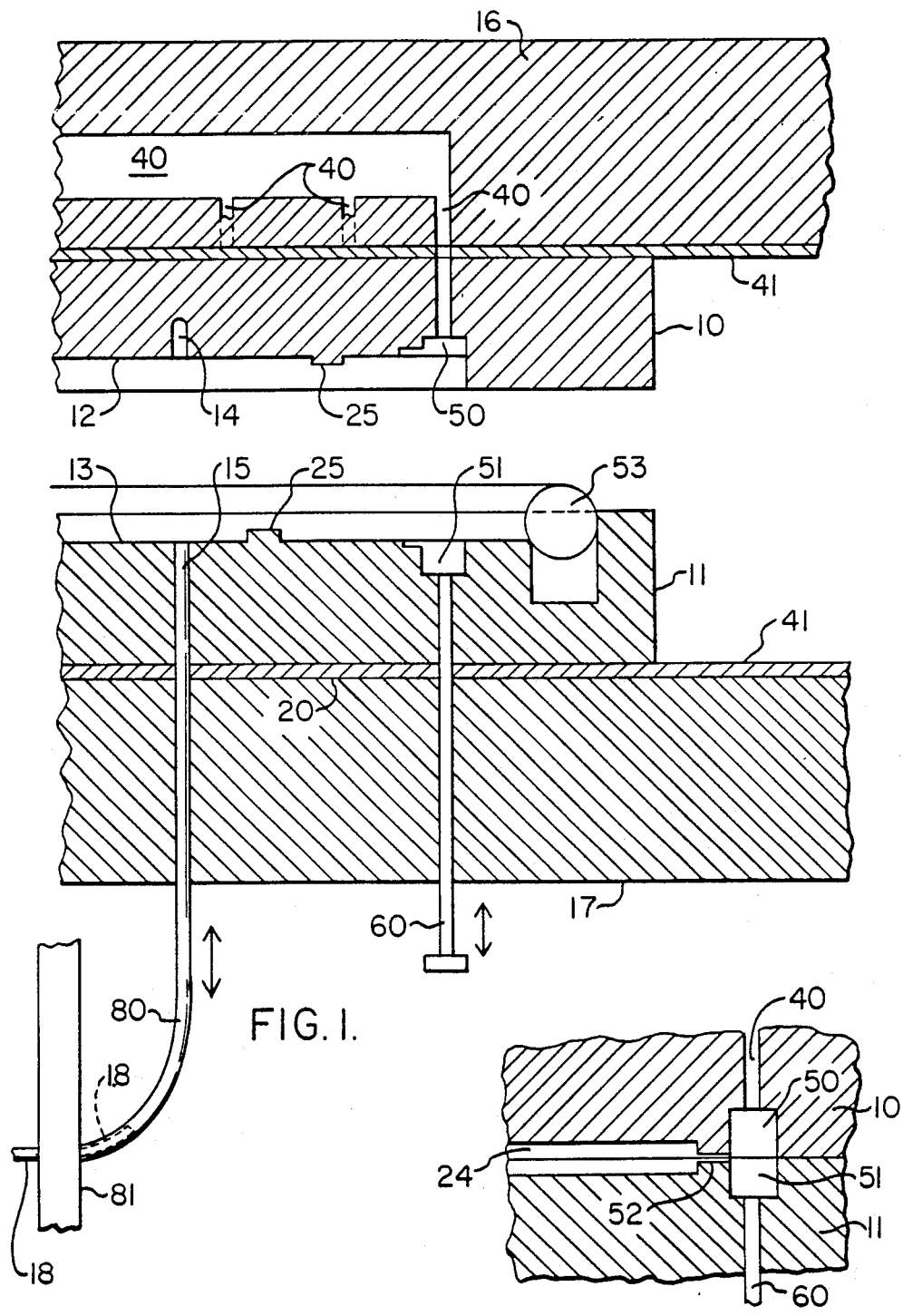

METHOD AND APPARATUS FOR THE INJECTION MOLDING OF CIRCUIT BOARDS

DESCRIPTION

1. Field of the Invention

This invention pertains to the field of injection molding, and more particularly to the injection molding of circuit boards having recessed circuit patterns and through-holes that are usable for mounting discrete circuit components.

2. Background of the Invention

Circuit boards, also called printed circuit boards, comprise a thin, electrically insulating, usually flat or planar, substrate that carries a pattern of fine-line electrical conductors on one or both surfaces thereof. Conventional circuit boards include means, such as through-holes, enabling discrete circuit components, i.e. resistors, capacitors, and the like, to be physically mounted on the board and to be electrically connected to the board's circuit pattern.

The present invention relates to the injection molding of circuit boards wherein unique molding features are provided, including, without limitation thereto, a core pin inserting feature, a hot runner injection system, location of molding gates and board ejectors in the board's scrap area, selective heating/cooling of the mold, and robot means, air, and vacuum to assist in ejection of the board from the mold cavity.

U.S. Pat. No. 3,889,363 describes the molding of printed circuit boards wherein one of the two opposing mold sections carries bosses or pins that result in through-holes. The mold cavity is evacuated, a conductive metal is vacuum deposited on the entire inner surface of the mold cavity, and a suitable plastic is injected into the mold. In this device, each individual circuit board mold includes the through-hole pins that are needed for that particular circuit board.

U.S. Pat. No. 4,591,220 also contains the above general teaching relative the molding of circuit boards.

A feature of the invention provides that the molded circuit board includes recessed areas that are later filled with conductive metal, to thereby form the board's circuit pattern.

U.S. Pat. No. 3,438,127 is of interest in that it describes the molding of circuit boards having through-holes, wherein the molded board includes recessed pattern areas that define the board's electrical circuit pattern.

A feature of the invention relates to the selective use of only certain ones of many core pins or wires, in accordance with the particular circuit board then being molded.

U.S. Pat. No. 4,342,549, which relates to another art, is of interest in this regard. This patent describes an arrangement for molding or casting articles, such as containers, identification tags, or otherwise shaped articles, wherein a mold wall includes a plurality of closely spaced holes, each of which contains a pin or shaft. A plurality of linear actuators are provided to selectively control movement of certain of the pins, partially or completely into the mold cavity. In this way, the molded article is formed with a coded pattern of partially-through-holes and/or fully-through-holes, as an article coding or identification means.

This patent does not relate to the art of molded circuit boards having through-holes formed therein. This patent merely provides a teaching as to how a molded article can be provided with a coded surface pattern, as a means of identifying the article.

Another patent that relates to a different art, but is of general interest, is U.S. Pat. No. 4,552,716. This patent describes how a wire matrix print head may be molded, wherein wires are inserted into the mold cavity, to thereby define molded passageways that will later guide the head's print wires.

This patent does not teach the forming of through-holes in molded circuit boards, nor does it teach how a family of individually different circuit boards can be molded by selecting only certain ones of a plurality of core pin wires for use with the mold for each individual member of the circuit board family.

A feature of the invention provides a means by which failure of a selected core pin or wire to penetrate the mold is detected.

In this regard, U.S. Pat. No. 4,491,295 is of general interest. This patent describes how a stack of circuit boards are drilled, to form through-holes therein, wherein a means is provided to detect failure of a drill bit to properly enter the mating blind hole that is formed in a lower plate that supports the stack.

SUMMARY OF THE INVENTION

This invention provides a method and apparatus for the injection molding of circuit boards having thin surface grooves, and having through-holes that extend between the surfaces of the board. After molding, the surface grooves are filled with metal, to thereby form the board's electrical circuit pattern. The through-holes are lined with metal that electrically connects to the circuit pattern. The lead wires of discrete circuit components are mounted in the through-holes.

The molding apparatus includes a single molding site having a pair of mold-supporting backup plates. These backup plates include means for injecting molding material to a removable mold, and means for ejecting a molded circuit board from the mold's cavity. The backup plate that contains the ejection means is movable relative the other backup plate.

Each mold of a family of molds is made up of a mating pair of cavity blocks, i.e. a mold or a mold stack. A different mold stack is provided for each member of the circuit board family that can be selectively molded by use of the backup plates at the molding site.

Prior to injection, the mold cavity is placed under a partial vacuum.

At least one of the backup plates includes a hot runner injection system, and injection occurs at the edge of the circuit board, in an area of the board that is scrap. The scrap area of the mold cavity is sized to act as a secondary runner, and also operates to properly control the flow of molding material into the center portion of the mold cavity.

A device, preferably a semiconductor device, is provided to rapidly heat the mold stack in preparation for injection, and to later rapidly cool the mold stack in preparation for ejection of the board from the mold cavity.

Mechanical ejector means, in the form of pins or blades, are located in at least one of the backup plates. This ejector means penetrates the mold stack so as to engage a molded board in its edge scrap area. The ejection force of positive pressure air may also be applied to the board, to aid in ejection of the board from the mold cavity. A vacuum chuck, mounted on a robot arm, can also be used to aid in removal of the board from the mold's cavity.

The board's through-holes are formed by inserting core pins, in the form of a plurality of lengths of flexible wire, into the mold cavity. Many such core wires are associated with at least one of the backup plates. However, only the core wires that are needed for the particular board family member then being molded are rendered active, i.e. moved into the mold stack. Thus, the plurality of core wires are programmed for use in accordance with the mold stack then resident at the molding site. In this way, the plurality of core wires are programmable to accommodate any one of a number of different boards, as is defined by the mold stack then in use at the molding site.

The construction and arrangement of the invention facilitates the ease of core wire replacement.

These and other features, objects and advantages of the invention will be apparent to those of skill in the art upon reference to the following detailed description of preferred embodiments of the invention, wherein reference is made to the drawing.

BRIEF DESCRIPTION OF THE DRAWING

FIG. 1 shows an embodiment of a molding apparatus in accordance with the invention, with the two cavity blocks, that comprise one mold stack, mounted on a pair of backup plates, one of the backup plates being movable to facilitate opening of the mold cavity, FIG. 2 shows the mold cavity of FIG. 1 in a closed position, and shows how injection of molding material into the usable central portion of the circuit board is controlled by means of a flow diverter or secondary runner that operates to control material flow from the scrap edge portion of the circuit board onto its central portion, FIG. 5 is a simplified view of a portion of one of the mold's two cavity blocks, this block having holes that define the through-hole pattern of the circuit board that is molded by this pair of cavity blocks, and also showing, in a simplified manner, how the backup plate for the cavity block supports a large number of movable core pin wires, only some of which are selected for movement into the mold cavity.

DETAILED DESCRIPTION OF THE INVENTION

The method and apparatus of the invention allows a family of circuit boards to be molded, each individual member of the family having its own unique double-sided circuit pattern and its own unique pattern of through-holes.

In the following detailed description, material selection will not be described. It is to be understood, that the various members will be fabricated out of suitable materials, well known to those of skill in the art.

Figure 4:
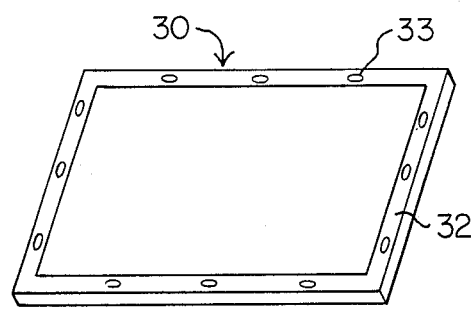
FIG. 4 shows an exemplary circuit board that has been molded in accordance with the invention.

An exemplary flat, planar circuit board 30 that may be molded using the method and apparatus of the invention is shown in FIG. 4. This board is an exemplary rectangular size of about 10 inches by about 10 inches, and is about 0.060 inch thick. For purposes of simplification, the board's circuit pattern and through-hole pattern has not been shown in FIG. 4. An edge portion 32 of the board surrounds the board's central useful area in which the circuit pattern and the through-holes are located. Molding material injection and board ejection occur in the board's peripheral scrap area 32. Marks 33 on circuit board 30 represent the physical location of mold stack injection gates and/or circuit board ejectors.

A mold stack 10,11 of FIG. 1 (i.e. a mating pair of cavity blocks 10,11) is provided for each member of the circuit board family. For example, if five circuit boards are in the board family, five different interchangeable mold stacks 10,11 are provided. The general construction and arrangement, and the external shape of each mold stack is common among all mold stacks of the family, such that all mold stacks will cooperate with a single pair of backup plates 16,17 that are located at a central molding site. Thus, all circuit boards of the family can be molded at this one site.

In accordance with standard practice, the one of the plates 16,17 that incorporates the board ejection means is movable in order to facilitate opening of the mold stack.

The internal cavity-forming wall 12,13 of each mold stack 10,11 contain only the core-wire holes 14,15 that are necessary to define the through-holes for that mold stack's unique circuit board. The hole pattern 14,15 of any given mold stack is usually different, both in the number and in the physical location of the holes 14,15. However, it will be appreciated that different members of the circuit board family may have similar through-hole patterns, but different circuit patterns. Stated differently, while a board's through-hole pattern defines a unique characteristic of that circuit board, each board's uniqueness is also characterized by its recessed circuit pattern.

One molding site (i.e. a common mold base comprising a pair of backup plates 16,17) is provided. At any one time, only a selected one of the family of mold stacks 10,11 is mounted at this site. The molding site, or common mold base 16,17, includes, without limitation thereto, (1) means for injecting molding material into the mold cavity, (2) means for ejecting the molded circuit board from the mold cavity, and (3) a plurality of movable mold-penetrating core pins.

FIG. 5 is a simplified showing of only a portion of FIG. 1's backing plate 17 and cavity block 11.

This figure shows a large number of core pin holes 19 formed in backing plate 17, each hole of which is provided with a core pin wire 18. Twelve of the core pin wires 18 are shown protruding from the surface 20 of back up plate 17 against which cavity block 11 rests (as is shown in FIG. 1). Cavity block 11 has twelve matching holes 15 that receive these twelve core pin wires. As shown in FIG. 1, the mating cavity block 10 receives and supports the ends of these twelve core pins wires in a matching pattern of twelve blind holes 14. In this way, this particular molded circuit board is provided with the required pattern of twelve through-holes.

Movement of the large plurality of core pin wires 18 (i.e. one wire for each hole that is formed in backup plate 17) is, in accordance with the invention, programmed to accommodate all of the various through-hole patterns that are contained in the plurality of mold stacks 10,11 in the circuit board family. In this way selective movement of certain ones of core pin wires 18 into a mold cavity then located at the molding site of FIG. 1 allows the through-holes of all members of the circuit board family to be formed, and only the mold stack 10,11 need be changed when a different circuit board is to be molded.

For the example shown in FIG. 5, there are twelve mold-penetrating pins 18, each of which is located at a known X-Y position relative backup plate 17. The mold stack located at the molding site has a corresponding X-Y hole pattern. In this example, all twelve core pins 18 are advanced into and through the mold cavity. The mold cavity is then filled with a molding material. After the material has set, pins 18 are withdrawn from the mold stack, the mold stack is opened, and the board is removed.

Now assume that a different mold stack 10,11 is placed at the molding site of FIG. 1, and that the holes 14,15 in this different mold stack correspond only to the physical locations of the two core pins 18 that are located at back up plate 17's X-Y coordinates (see the coordinate system of FIG. 5) "column 5-row 8" and "column 7-row 10". In this case, only these two pins 18 are advanced into the mold cavity prior to filling the cavity with molding material.

In this manner, a single molding site (FIG. 1), and a single array of mold penetrating pins 18 (FIG. 5), accommodates the molding of an entire family of circuit boards, each member of the circuit board family having its own unique mold stack.

A primary feature of the invention provides this unique construction in an arrangement for forming through-holes in molded circuit boards.

In this aspect of the invention, the invention provides means (i.e. FIG. 1) for molding a selected one of a family of circuit boards, where all members of the board family include a pair of cavity blocks 10,11 having generally the same external dimensions, and generally the same injection/ejection accommodating means. As a result, all cavity block combinations of the circuit board family can be accommodated at the same molding site.

Each member of the board family includes a unique circuit pattern 25 and a unique pattern of through-holes (see 15 of FIG. 5) that are used for the insertion of discrete circuit components. As a result, the single molding site must include a means (i.e. 17 of FIG. 5) to accommodate the forming of all possible through-hole patterns. In accordance with the invention, this hole forming means is selectively programmed in accordance with the unique through-hole pattern of the circuit board actually being molded at any given time.

Figure 6:
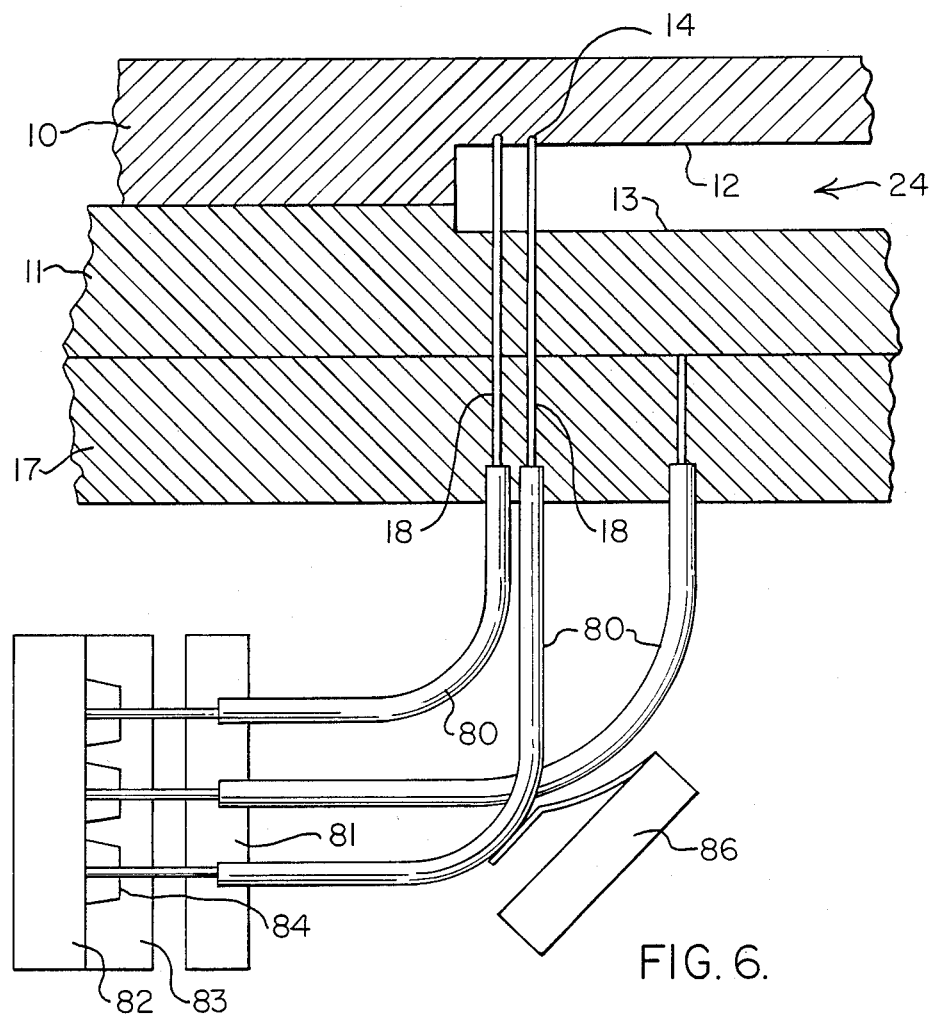
FIG. 6 shows a portion of the core pin wire construction and arrangement of FIG. 5, showing two core pin wires that have been moved into the mold cavity, so as to seat in blind holes formed in the second cavity block of the mold stack, and showing one wire that has not been selected for use with the mold cavity.

FIG. 6 should be considered with FIG. 5. FIG. 6 has been simplified to show only three of the many core pin wires 18 that are used to form two through-holes in the board to be molded in cavity 24 which is formed by cavity block 10 and cavity block 11. In actual practice, a large number of such core pin wires are provided at the molding site, as shown in FIG. 5.

All such core pin wires are encased within a spiral wound shield 80, and the end of this shield is connected to one of four fixed-position termination plates 81. Termination plates 81 are also seen in FIG. 5. Each plate 81 provides termination for ¼th of the core pin wires 18 that are held by cavity backing plate 17. Each side of the cavity plate mounts a similar terminator plate, and each of these plates provides termination for ¼th of the core pin wires that are contained in backing plate 17's X-Y coordinate matrix of core pin wires. For purposes of simplicity, FIG. 5 does not show all of these core pin wires extending out of the terminator plates, as they do in actual practice and as is shown in FIG. 6.

Figure 7:
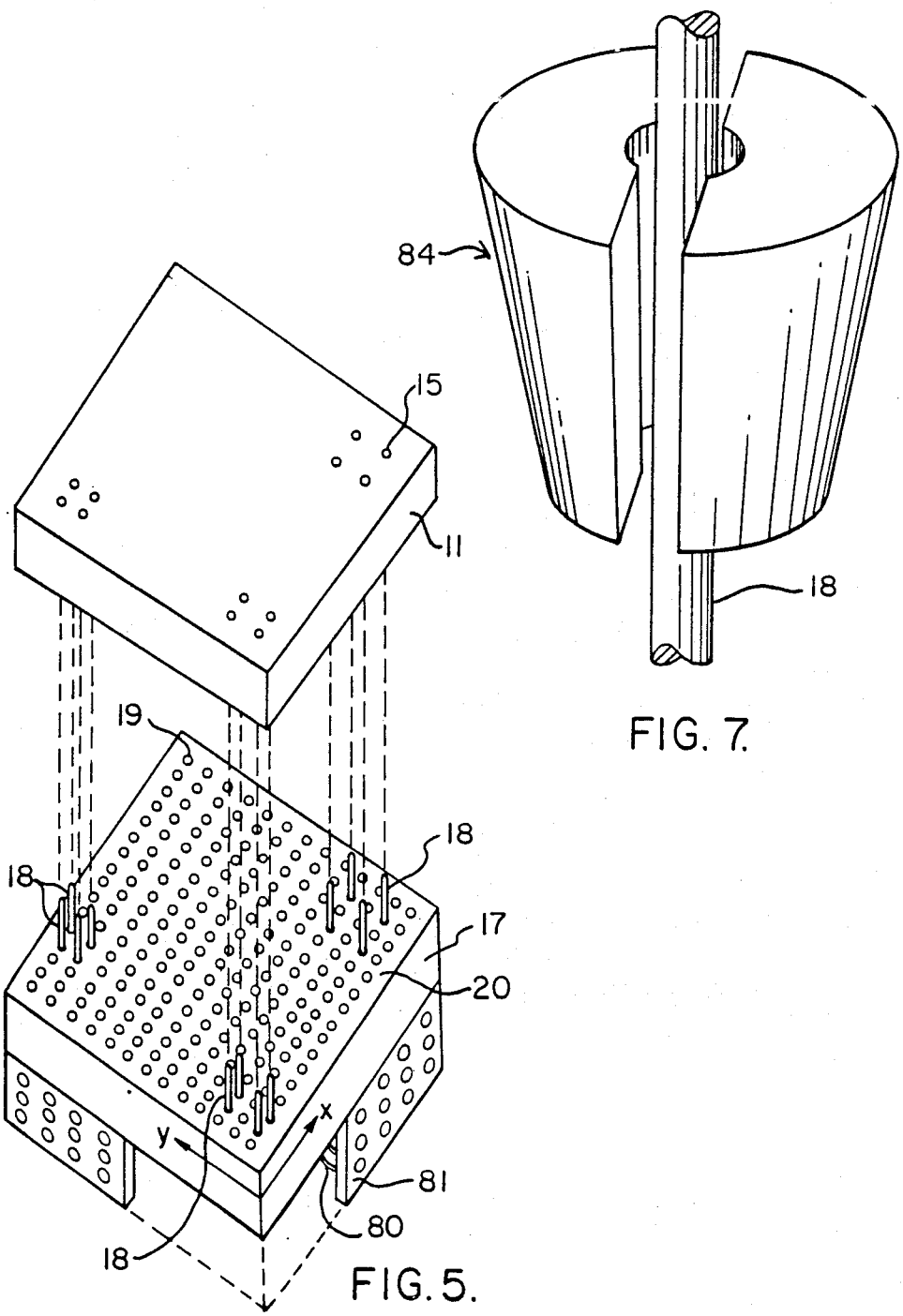
FIG. 7 shows the wire-holding collet of FIG. 6, this collet facilitating the programming of which core pin wires are to be used with a mold stack, and/or facilitating replacement of damaged core wires during maintenance of the molding site.

Those core pin wires 18 that are programmed to be used with the particular mold stack 10,11 then in use at the FIG. 1 molding site are connected to movable plates 82 and 83 (these plates are not shown in FIG. 5). The ends of these particular wires are secured to plates 82,83 by the use of a two-piece split collet 84 (collet 84 is also shown in FIG. 7). Each one of the core pin wires selected or programmed for use with a particular mold stack 10,11 cooperates with a through-hole 15 that is formed in cavity block 11 of that mold stack, and cooperates with a mating blind hole 14 that is formed in cavity block 10 of mold stack. Thus, there is a one-to-one correspondence between the circuit board's through-hole pattern and the core pin wires 18 that are selected or programmed for use with that board's mold stack.

All other core pins wires 18 are inoperative (i.e. not used) with the particular cavity block pair 10,11 under consideration. Those core pin wires 18 that are not programmed to be used with the particular cavity block pair freely pass through plates 82,83 without being attached thereto.

By way of an example of a programming means, but without limitation thereto, plates 82 and 83 of FIG. 6 are moved apart, to thereby open all of the collets 84. Plates 82,83 are then moved to the right. The wires 18 that cooperate with a hole in cavity block 11 (two such wires are shown in FIG. 6) move with plates 82,83, and as a result these wires penetrate mold cavity 24, and seat in mating holes 14 of cavity block 10. However, those wires 18 that do not cooperate with a hole in cavity block 11 (one such wire is shown in FIG. 6) slide relative to their open collet 84. Plates 82 and 83 are now moved back together, and the plates are secured in that position, to thereby close all of the collets 84.

As those skilled in the art will appreciate, many other detailed constructions and arrangements can be provided within the scope and spirit of this invention to program only certain core pin wires 18 for use with any given mold stack 10,11. Thus, the invention is not to be limited to the embodiments described herein. For example, within the teachings of this invention, a slip-clutch means may be provided such that all core pin wires of FIG. 5 are subject to a force tending to advance the wires toward cavity block 11. However, if a hole 15 is not present in the cavity block for a particular wire, that particular wire merely slips relative to the force means.

In the operation of FIG. 6, after the mold stack 10,11 closes, core pin wire retaining means comprising plates 82,83 is moved to the right. This operation causes the ends of the core pin wires to pass through mold cavity 24, so that the ends of the wires seat in blind holes 14 formed in the surface 12 of cavity block 10.

Subsequent injection of molding material into cavity 24 produces a circuit board having a unique pattern of through-holes, in accordance with the pattern of programmed core pin wires 18.

After the molding material has solidified, plates 82,83 move back to the left, withdrawing the ends of the core pin wires 18 from mold cavity 24. The mold is then opened, and the board is ejected from the mold cavity.

In the event that a progammed-for-use core pin wire 18 fails to properly move, for example to seat in its blind hole 14, the shielding member 80 associated with that particular wire will flex out of its normal position. A feature of the invention provides a position sensor such as 86 adjacent each shielding member 80. In the event of such a failure, sensor 86 provides an output signal, and the molding cycle is aborted.

The feature of the above construction and arrangement, whereby selected core pin wires 18 are secured to plates 82,83 by way of split collet 84, and whereby the not-selected wires 18 freely pass through these plates, facilitates the ease of replacement of broken or worn core pin wires.

Each of the mold stacks 10,11, from which a unique member of the circuit board family is molded, includes a mold cavity 24 (see FIG. 2 for example) whose surface includes the engraved pattern of core members 25 (FIG. 1) that define the board's unique recessed electrical circuit pattern.

The circuit pattern that is defined by core members 25 (shown in a very simplified form in FIG. 1) can be formed in cavity blocks 10,11 in two exemplary manners. One is the well known mold-tech texturing process normally used to provide decorative mold patterns. This technique will provide circuits of approximately 4 mils line width. For finer circuit lines, the mold's surface circuit patterns can be provided using the well known stamper techniques used to produce video disks and the like. This process has the ability of producing circuit lines in the micro size range.

The mold, comprising a mold stack 10,11, provides and/or accommodates three main functions. Namely, injection of material into the mold cavity, transfer of heat from the mold cavity through the mold stack to a cooling system, and ejection of the circuit board from the mold cavity.

The molding material normally used to make circuit boards is a highly viscous material. Thus, it is difficult to fill a mold cavity that has relatively large proportions, using conventional molding machines and techniques.

A feature of the invention provides a hot runner injection system in cavity block 10. This hot runner system provides a heated path 40 for injection of high viscosity molding material into mold cavity 24.

With reference to FIG. 2, molding material flows into cavity block 10 thru a number of conduits 40. When mold stack 10,11 is closed, as is shown in FIG. 2, the closed mold cavity is sealed by rectangular-shaped 0-ring 53 that surrounds cavity 24. This closed mold cavity forms a rectangular-shaped, relatively large cross section, border portion 50,51 that must fill before the molding material will flow through rectangular-shaped, narrow cross section, flow restricting slot 52. In this way, the center portion of the circuit board cavity fills uniformly from all four sides, or perhaps from two opposite side.

In addition, the invention provides a means 41 for preheating mold stack 16,17, to thereby form an extension of hot runner injection system 40 during material injection. Hot runner system 40 reduces the effective flow length for the high viscosity molding material, thereby reducing the pressure required to fill the mold cavity 24. This in turn reduces the clamping force that is required to clamp mold stack 10,11 in its closed condition, shown in FIG. 2. These items are important, considering the small thickness dimension of circuit boards and the high viscosity of the molding material.

By way of example, hot runner system 40 is an "M" series hot runner manifold, manufactured by Husky Injection Molding Systems.

Preferably, a semiconductor device, such as is described in the publication "Low Thermal Inertial Injection Molding" by Byung H. Kim, University of Massachusetts, is used for member 41 of FIG. 1 to quickly heat mold stack 10,11 prior to injection. This device 41 is also used to quickly cool the mold stack prior to ejection of the circuit board from the mold cavity. Use of such a heating/cooling device 41 raises the mold temperature to about the melt temperature of the molding material, effectively providing an extension of hot runner injection system 40, and also assists in ejection of the molded part.

With reference to FIGS. 1 and 2, a feature of the invention is that injection gate locations 50,51 are placed in the mold's cavity blocks 10,11 within the scrap edge area 32 of the rectangular, generally planar circuit board 30 being molded. Preferably, gate locations 50,51 are located along all four sides of the rectangular mold cavity within mold stack 10,11, as is shown by marks 33 in FIG. 4.

This unique location of the injection gates eliminates the creation of material gate marks and flow marks on the central area of board 30 that is reserved for the circuit pattern and through-holes. This gate location is maintained identical for all members of the circuit board family. If some of the board family members are of a smaller rectangular size, then these smaller boards will have peripheral scrap area 32. This fixed gate location desirably provides uniform material shrinkage from one board family member to the next. Although this advantage may result in somewhat larger edge waste for the small-board members of the family, the resulting scrap can be ground and reused.

Figure 3:
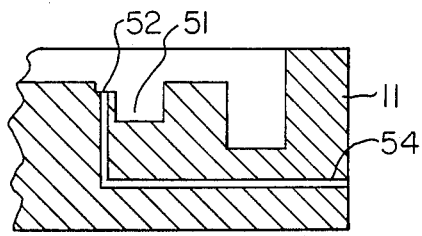
FIG. 3 shows the location of an air-evacuating vacuum port in the edge portion of one of the mold's two cavity blocks.

Prior to injection of molding material into cavity 24 (FIG. 2), the cavity is exhausted of air and placed under a partial vacuum. As shown in FIG. 3, at least one portion of cavity block 11 (different from the portion shown in FIG. 1) is provided with a vacuum conduit 54 that communicates with the bottom portion of flow-restricting slot 52. Prior to injection of molding material into channel 50,51 by way of hot runner system 40, mold cavity 24 is placed under partial vacuum by operation of a vacuum pump (not shown) that is connected to conduit 54.

As a result, during injection of molding material into the mold cavity, resistance to flow caused by entrapped air is minimized, as is the tendency of the molding material to burn.

An important consideration in the molding of circuit boards is ejection of the board from the mold cavity. Circuit boards by their very nature are somewhat fragile, and the complex circuit pattern and complex through-hole pattern carried by the board may make it difficult to eject the board from cavity block 11. For example, the pattern of through-holes required on a board may provide a natural fracture line across surface of the board.

A feature of the invention provides for reliable ejection of the circuit board from the mold cavity.

As seen in FIGS. 1 and 2, a plurality of ejector pins 60 (and perhaps ejector blades, not shown) are provided to cooperate with only the board's peripheral scrap area 32. In this way, a common ejection means is provided for all members of the circuit board family.

Figure 8:
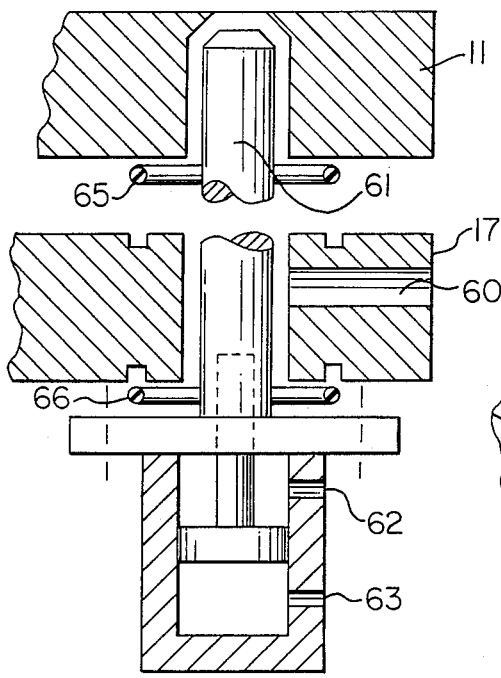
FIG. 8 shows an air ejection valve adapted to be located in one of the mold's cavity blocks so as to cooperate with the circuit board's edge scrap area.
Figure 9:
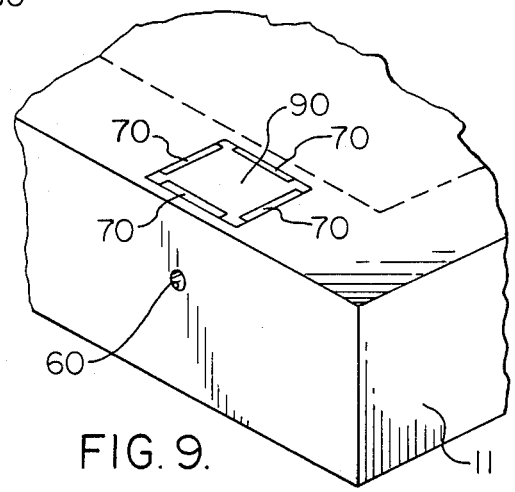
FIGS. 9 and 10 show an open-slot form of an air ejector adapted to be located in one of the mold's cavity blocks so as to cooperate with the circuit board's edge scrap area.
Figure 10:
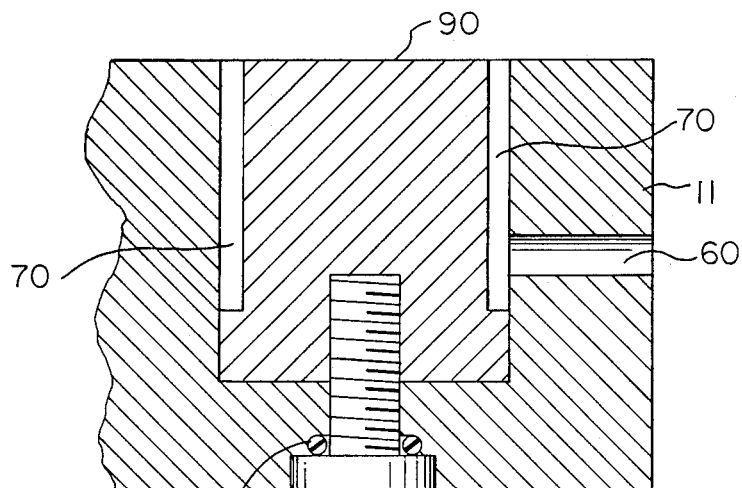

In addition, air ejection is provided in cavity block 11, as shown in FIGS. 8-10. In the embodiment of FIG. 8, cavity block 11 includes two portions to facilitate installation of a movable air valve. In the embodiment of FIGS. 9 and 10 a passive air flow means is provided, and cavity block 11 is of one piece construction in the area of the air flow means.

By way of the air ejection means shown in FIGS. 8-10, operation of positive air pressure against the board's central surface area assists in ejection of the board from molding cavity 24. More specifically, air enters and fills the mold cavity, behind the entire area of the board. This air pressure causes the board to break away from the mold cavity.

In FIGS. 8-10, ejection air pressure is provided to conduit 60 by way of an air pump, not shown.

In FIG. 8, air is provided to the board's peripheral scrap area 32 when valve stem 61 is lowered by operation of fluid pressure applied to value retract port 62. When fluid pressure is applied to valve advance port 63, valve stem 61 is raised, to thereby seal opening 64 that is formed in the portion of cavity block 11 adjacent the board's scrap area 32.

The arrangement of FIG. 8 is sealed by the operation of O-rings 65 and 66.

A second means, including block 90, for providing air ejection assist is shown in FIGS. 9 and 10. In this arrangement, narrow slot-type air flow paths 70 are formed in cavity block 11, adjacent the board's scrap area 32. The size of slots 70 is such that molding material will not flow into the slots. However, after the board has solidified, air pressure applied to slots 70, by way of port 60, operates to assist in ejection of the board. Again, the assembly is sealed by the use of an O-ring 71.

An additional feature (not shown) provides for a robot-controlled vacuum chuck to engage the exposed side of the circuit board, and to assist in lifting the board out of cavity block 11. More specifically, a flat plate of suitable size contacts the exposed side of the circuit board. By means of an O-ring seal, and suitable vacuum porting, the area between the plate and the circuit board is evacuated. The plate is then caused to operate as a vacuum chuck, applying a force to lift the board out of cavity block 11.

The invention, as well as its objects and advantages, have been described with reference to preferred embodiments thereof in order to enable those skilled in the art to practice the invention. However, other embodiments of the invention will be apparent to those of skill in the art, and the spirit and scope of the invention is not to be limited by the above description of the invention.

What is claimed is:

1. A method of molding a selected one of a family of circuit boards, wherein the plural circuit boards of the family include through-holes that are arranged in different physical patterns, the method comprising;

providing a plurality of different cavity block pairs, one pair for each of said plural different-pattern circuit boards, the cavity blocks of each of said pairs of cavity blocks having through-holes arranged in the pattern of the through-holes to be molded into its circuit board, providing a molding site that will accommodate any one of said cavity block pairs and whereat said one of said family of cavity block pairs may be mounted, providing a plurality of mold penetrating core pin means at said molding site, said core pin means being sufficient in number, and being located in a pattern so as to cooperate with the through-holes of all cavity block pairs of said family, placing said one cavity block pair at said molding site, moving only the core pin means corresponding to those required by said one cavity block pair, so as to penetrate the through-holes of said one cavity block pair, filling a circuit board cavity within said one cavity block pair with a molding material, opening said one cavity block pair, and removing a molded circuit board from the cavity in said one cavity block pair.

2. The method of claim 1 including the step of providing circuit board ejection means at said molding site, said ejection means being constructed and arranged to cooperate with all cavity block pairs of said family.

3. The method of claim 2 wherein said ejection means cooperates with a scrap area of the circuit board molded in said cavity.

4. The method of claim 2 including the step of providing molding-material injection means at said molding site, said injection means being constructed and arranged to cooperate with all cavity block pairs of said family.

5. The method of claim 4 wherein said ejection means and said injection means cooperate with a scrap area of the circuit board molded in said cavity.

6. The method of claim 4 including the step of providing a hot runner injection means.

7. The method of claim 6 including the step of heating said one cavity block pair prior to injection of molding material.

8. The method of claim 7 including the step of at least partially evacuating air from the cavity in said one cavity block pair prior to injection of molding material.

9. The method of claim 5 including the step of heating said one cavity block pair prior to injection of molding material.

10. The method of claim 1 including the step of providing hot runner molding material injection means at said molding site, said injection means being constructed and arranged to cooperate with all cavity block pairs of said family.

11. The method of claim 10 including the step of heating said one cavity block pair prior to injection of molding material.

12. Apparatus for selectively molding one of a plurality of circuit boards, wherein the circuit boards include through-holes having different physical pattern configurations, comprising;

a plurality of different cavity block pairs, each cavity block pair corresponding to each of said plurality of circuit boards, and each cavity block pair providing a different pattern of through-holes, a molding site including back up plate means for supporting any selected cavity block pair from said plurality of different cavity block pairs, a plurality of movable core pins means mounted at said molding site in cooperation with said back up plate means,
said core pins means being sufficient in number, and being physically located in a pattern so as to be programmable to cooperate with the through-holes of all of said cavity block pairs,
programming means for selectively moving only the core pins means corresponding to those that are required by any selected cavity block pair that is supported at said molding site, so as to provide the core pins means for each through-hole of said selected cavity block pair, and
means for filling a cavity within said selected cavity block pair with a molding material.

13. The apparatus of claim 12 including circuit board ejection means at said molding site constructed and arranged to cooperate with all of said cavity block pairs.

14. The apparatus claim 13 wherein said ejection means cooperates with a scrap area of the circuit board to be molded in said cavity.

15. The apparatus of claim 14 including molding material injection means mounted at said molding site for injecting molding material under pressure into the cavity of said selected cavity block pair, said injection means being constructed and arranged to cooperate with all of said cavity block pairs.

16. The apparatus of claim 15 wherein said injection means cooperates with a scrap area of the circuit board molded in said cavity.

17. The apparatus of claim 15 including hot runner injection means for injecting molding material into said cavity.

18. The apparatus of claim 17 including means for heating said selected cavity block pair prior to injection of molding material.

19. The apparatus of claim 15 including means for at least partially evacuating air from the cavity in said selected cavity block pair prior to injection of molding material.

20. The method of claim. 19 including means for heating said selected cavity block pair prior to injection of molding material.

21. The apparatus of claim 20 including hot runner injection means for injecting molding material into said cavity.

22. Molding apparatus for use in molding one of a family of generally similar articles having through-holes, comprising:
first cavity block means for each of one of said family of articles, each of said first cavity block means having a variable number "A" of through-holes formed therein,
backing plate means for supporting a selected one of said first cavity block means,
said backing plate means having a number "B" of movable, elongated, flexible core pin wires mounted to cooperate with the through-holes of any selected one of said first cavity block means, wherein the number "B" is greater than the number "A",
second cavity block means for each one of said family of articles, said second cavity block means being supported relative said first cavity block means so as to define an article cavity therebetween, said through-holes in said first cavity block means connecting to said article cavity,
said second cavity block means having the number "A" of blind holes formed therein, said blind holes being located generally opposite the through-holes that are formed in said first cavity block means, said blind holes being adapted to receive and support an end of each of said "A" core pin wires on the opposite side of said article cavity from said through-holes,
core pin programming means for programming movement of the number "A" of said core pin wires through the through-holes of said first cavity block means, and into said article cavity, in accordance with the selection of the one of first cavity block means for mounting on said backing plate means, and
sensing means operable to sense failure of any one of said "B" core pin wires to properly move into said article cavity.

23. The apparatus of claim 22 wherein said core pin programming means includes releasable wire-holding collet means operable to facilitate programming of said "A" quantity of core pin wires for movement, and facilitating replacement of individual damaged core pin wires.

24. The apparatus of claim 22 wherein the article to be molded is a printed circuit board having a peripheral scrap area and a generally central area that is dedicated to the board's circuit pattern and through-hole pattern, and wherein said article cavity includes a peripheral cavity portion corresponding to the board's scrap area, and a central cavity portion corresponding to the board's central area, the apparatus including;
second backing plate means mounting said second cavity block means,
a pressure injection system contained in at least one of said first or second backing plate means, and cooperating with said peripheral cavity portion, to effect initial injection of molding material into said peripheral cavity portion, and
material flow restricting means connecting said peripheral cavity portion to said generally central cavity portion, so as to cause said central cavity portion to fill uniformly from said peripheral cavity portion.

25. The apparatus of claim 24 including a hot runner injection system in said at least one of said first or second backing plate means.

26. The apparatus of claim 25 including means for heating at least one of said first and second cavity block means prior to injection of molding material into said article cavity.

27. The apparatus of claim 26 including ejection means cooperating with said first backing plate means so as to eject said circuit board by force applied to said scrap area.

28. The apparatus of claim 27 wherein said ejection means includes the application of air pressure to said scrap area.

29. The apparatus of claim 28 wherein said core pin programming means includes releasable wire-holding means operable to facilitate programming of said "A" quantity of core pin wires for movement, and facilitating replacement of individual damaged core pin wires.

* * * * *